US007008831B2

(12) United States Patent
Sasaki

(10) Patent No.: US 7,008,831 B2
(45) Date of Patent: Mar. 7, 2006

(54) SEMICONDUCTOR DEVICE AND MANUFACTURING METHOD THEREOF

(75) Inventor: Katsuhito Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/822,752

(22) Filed: Apr. 13, 2004

(65) Prior Publication Data

US 2005/0098838 A1 May 12, 2005

(30) Foreign Application Priority Data

Nov. 10, 2003 (JP) ............................ 2003-379712

(51) Int. Cl.
*H01L 29/41* (2006.01)

(52) U.S. Cl. ...................... 438/163; 438/303; 257/401; 257/344; 257/408

(58) Field of Classification Search ................ 257/344, 257/408, 401, E21.435, E29.137, 336, 153, 257/387, E29.134, E21.437, E21.442, E21.634, 257/E21.635; 438/163, 217, 289, 157, 303, 438/304

See application file for complete search history.

(56) References Cited

U.S. PATENT DOCUMENTS 5,658,808 A * 8/1997 Lin ............................ 438/155
6,190,981 B1 2/2001 Lin et al.
6,555,425 B1 4/2003 Huang et al.
6,580,129 B1 * 6/2003 Lui et al. .................... 257/347

FOREIGN PATENT DOCUMENTS

| | | |
|---|---|---|
| JP | 05-110071 | 4/1993 |
| JP | 09-205205 | 8/1997 |
| JP | 2002-289845 | 10/2002 |

* cited by examiner

*Primary Examiner*—Tom Thomas
*Assistant Examiner*—Matthew C Landau
(74) *Attorney, Agent, or Firm*—Volentine Francos & Whitt, PLLC

(57) ABSTRACT

A method of manufacturing a semiconductor device, including forming a gate insulating film on a P type semiconductor layer, forming on the gate insulating film a gate electrode having slits at, at least an end thereof on the drain electrode forming predeterminate side, selectively implanting an N type impurity into the P type semiconductor layer with the gate electrode as a mask, effecting heat treatment to activate the impurity and integrating impurity regions in which the impurity is implanted in the slits and portions outside the gate electrode, by transverse direction thereby to form a pair of N type low-density diffused layers that overlap, at least, on the drain electrode side of the gate electrode, and forming a pair of N type high-density diffused layers spaced away from the gate electrode.

5 Claims, 3 Drawing Sheets

SEMICONDUCTOR DEVICE AND MANUFACTURING METHOD THEREOF

BACKGROUND OF THE INVENTION

1. Field of the Invention

The present invention relates to a semiconductor device, and particularly to a MOS transistor based on high breakdown voltage specs and a manufacturing method thereof.

2. Description of the Related Art

A conventional high voltage MOS transistor has a structure wherein low-density diffused layers overlap with a gate electrode underneath the gate electrode to relax an electric field under the gate electrode to thereby suppress the occurrence of hot carriers. A method of manufacturing the conventional high voltage MOS transistor will be explained below with an N type MOS transistor as an example with reference to a process sectional views of FIGS. 3(*a*)–3(*c*).

An insulating film 302 such as an oxide film is formed on a P type semiconductor substrate 301 by known oxidation or a known CVD technique. Next, a resist pattern 303 is formed thereon by a known photolithography technique. Thereafter, an N type impurity such as phosphorus ions are implanted at a dose of 6.0 E+12 $cm^{-2}$ by a known ion implantation technique. Next, the N type impurity is activated by a known diffusion technique to form N type low-density diffused layers 304 which serve as layers for relaxing source and drain electric fields in the MOS transistor (see FIG. 3(*a*)).

Next, the resist pattern 303 is removed and a polysilicon film is deposited on the insulating film 302 by the known CVD technique. Afterwards, the polysilicon film is patterned by using a known photolithography and etching technique to form a gate electrode 305 (see FIG. 3(*b*)). Incidentally, at this time, the gate electrode 305 is formed in a structure in which the low-density diffused layers overlap with the gate electrode under the gate electrode, in such a manner that the gate electrode 305 covers parts of the N type low-density diffused layers 304 through the insulating film 302 by about 1.5 μm.

Next, a resist pattern is formed by the known photolithography technique. Thereafter, an N type impurity such as As is implanted at a dose of 1.0 E+15 $cm^{-2}$ by the known ion implantation technique to form N type high-density diffused layers 306 for drawing source and drain electrodes of the MOS transistor (see FIG. 3(*c*)). Incidentally, at this time, the N type high-density diffused layers 306 are formed away from the gate electrode 305.

Subsequently, a high voltage MOS transistor having a structure in which low-density diffused layers overlap with a gate electrode underneath the gate electrode, is formed via contact formation and wiring formation. Incidentally, both the contact formation and wiring formation are done using a known technique and are not shown in the figure.

In order to improve breakdown voltage characteristics of the MOS transistor, Japanese Unexamined Patent Publication No. Hei 9(1997)-205205 cited as a patent document describes a method of forming high density layers for drawing or withdrawing source and drain electrodes at arbitrary and uniform positions, whereas Japanese Unexamined Patent Publication No. 2002-289845 cited as a patent document describes a method of forming low and high density layers in desired regions on a self-alignment basis.

However, the above-described patent documents make no mention of the fact that the gate electrode is caused to overlap with the low density layers in a desired length. The method of manufacturing the high voltage MOS transistor having such a structure that the low-density diffused layers for field relaxation and the gate electrode both formed as described in the prior art have overlapped, was accompanied by the problem that there was a need to form the gate electrode after the formation of the low-density diffused layers, and when the photolithography technique was used, there was a need to determine the dimensions of the portions where the low-density diffused layers and the gate electrode overlapped in consideration of allowances for alignment between pattering for forming the low-density diffused layers and patterning for forming the gate electrode, thereby causing interference with device's miniaturization.

SUMMARY OF THE INVENTION

Therefore, the present invention has been made in view of such a problem. An object of the present invention is to provide a novel and improved semiconductor device in which low-density diffused layers are formed in a self-alignment with a gate electrode to thereby avoid a need to take into consideration dimensions corresponding to allowances for photolithography alignment with respect to portions where the low-density diffused layers and the gate electrode overlap, and which enables a reduction in transistor size while having a high breakdown voltage, and a method of manufacturing the semiconductor device.

According to one aspect of the present invention, for solving the above problem, there is provided a method of manufacturing a semiconductor device, comprising the steps of forming a gate insulating film on a first conductivity type layer of a semiconductor substrate, forming on the gate insulating film, a gate electrode having slits at, at least, one ends thereof on the drain electrode forming predeterminate side, selectively implanting a second conductivity type impurity in the first conductivity type layer with the gate electrode as a mask, effecting heat treatment to activate the impurity and integrating, by transverse diffusion, impurity regions in which the impurity is implanted in the slits, and impurity regions in the neighborhood of the slits, in which the impurity is implanted in regions outside the gate electrode, thereby forming a pair of second conductivity type layers which overlap with the gate electrode on, at least one sides on the drain electrode forming predeterminate side, of the gate electrode, and forming within the pair of second conductivity type layers, a pair of second conductivity type high-density layers which are spaced away from the gate electrode and adapted to contact source and drain electrodes respectively.

Here, the drain electrode forming predeterminate side means the side in which in a structure of a field effect transistor having source and drain electrodes formed on both sides of a gate electrode, the drain electrode is to be formed in a subsequent process step although the drain electrode is not formed at the present time. Also, the structure in which the second conductivity type layers overlap with the gate electrode, shows a structure wherein a pair of second conductivity type layers are intruded into a gate electrode lower portion so as to narrow a region of a first conductivity type layer at the gate electrode lower portion formed on the first conductivity type layer with a gate insulating film interposed therebetween, and the ends of the gate electrode are located above the second conductivity type layers.

Thus, the gate electrode having the slits at the ends thereof is formed, and ion implantation is done with the gate electrode as a mask. The transverse diffusion is induced by heat treatment for activation to integrate the impurity regions at the slits and the adjacent impurity regions on the outer side of the gate electrode thereby to form the second conductivity type layers, whereby the second conductivity type layers that overlap with the gate electrode can be formed on a self-alignment basis.

In particular, the high voltage MOS transistor needs to have such a structure that low-density diffused layers overlap with a gate electrode in order to relax an electric field and prevent the occurrence of hot carriers. The conventional method using the photolithography needed to take an overlap length (length of each overlapped portion) more than necessary in consideration of alignment accuracy in order to allow the gate electrode and the second conductivity type layers each corresponding to the diffused layer to overlap. Since, however, a desired overlap length can be taken on a self-alignment basis in the present invention, there is no need to provide overlap more than necessary and the dimensions can be minimized while maintaining device performance and reliability.

Since the high voltage MOS transistor needs a sufficient overlap length for allowing at least the gate electrode and each second conductivity type layer on the drain side to overlap with each other to perform drain field relaxation in question in particular, it is desirable to form the slits on, at least, the drain side of the gate electrode and allow the gate electrode and the second conductivity type layer to overlap by a desired length.

In order to form the second conductivity type layers that overlap with the gate electrode in the desired length, the length from the end of each slit to the end of the gate electrode near the slit, i.e., the length of the end portion of the gate electrode may preferably be formed to a length in which the impurity region in which the impurity is implanted in the corresponding slit, and the impurity region in which the impurity is injected into the outside of the gate electrode, are integrated by transverse diffusion based on heat treatment.

According to the above manufacturing method, there is provided a semiconductor device comprising a pair of second conductivity type layers formed away from each other within a first conductivity type layer of a semiconductor substrate, a gate insulating film formed over the first conductivity type layer and the second conductivity type layers, a gate electrode formed on the gate insulating film so as to connect the pair of second conductivity type layers and allow at least one sides on the drain electrode side to overlap and having slits at portions above ends of the overlapped second conductivity type layers, and a pair of second conductivity type high-density layers respectively formed within the second conductivity type layers so as to be spaced away from the gate electrode and to contact a source electrode and a drain electrode respectively.

While the second conductivity type layers employed in the present structure are formed by integrating the impurity regions in which the impurity is implanted into the slits and the impurity regions in which the impurity is implanted into the outside of the gate electrode, the portions below the ends of the gate electrode lying outside the slits can be set lower in density than other portions because the portions are boundary portions. The ability to lower the densities below both ends of the gate electrode in particular makes it possible to suppress field concentration effectively and suppress the occurrence of hot carriers.

According to the present invention as described above in detail, since the low-density diffused layers are formed on a self-alignment basis after the formation of the gate electrode, the portions where the low-density diffused layers and the gate electrode overlap, can be respectively formed to a desired length and density and in a uniform manner. Further, there is no need to take into consideration the dimensions equivalent to allowances for photolithography alignment. It is, therefore, possible to provide a semiconductor device which enables a reduction in transistor size while having a high breakdown voltage, and a method of manufacturing the semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1A:
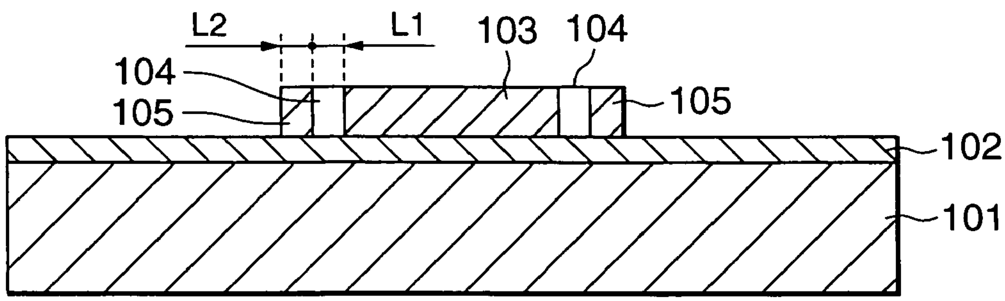
FIGS. 1(*a*)–1(*c*) are process sectional views showing a method of manufacturing a semiconductor device according to a first embodiment, wherein FIG. 1(*a*) is a view subsequent to the formation of a gate electrode, FIG. 1(*b*) is a view subsequent to the implantation of an impurity, and FIG. 1(*c*) is a view subsequent to the formation of N type low-density diffused layers.

Preferred embodiments of the present invention will hereinafter be described in detail with reference to the accompanying drawings. Incidentally, elements of structure each having substantially the same functional constitution are respectively identified by like reference numerals in the present Specification and drawings, and the description of common elements of structure will therefore be omitted.

First Embodiment

As a first embodiment, a method of manufacturing an N type MOS transistor will be explained here using the process sectional views of FIGS. 1(*a*)–1(*c*), a sectional view of FIG. 2(*a*) and a schematic plan view of FIG. 2 (*b*) with the N type MOS transistor as an example. First, an insulating film 102 such as an oxide film used as a gate insulating film is formed about 100 nm on a P type semiconductor layer 101 corresponding to a first conductivity type layer of a semiconductor substrate by using the known oxidation or CVD method.

Next, for example, a polysilicon film serving as a gate electrode material is deposited on the insulating film 102 by the known CVD technique. Thereafter, the polysilicon film is patterned using the known photolithography process and etching process to form a gate electrode 103. Incidentally, at this time, slits are provided at, at least, one ends on the drain electrode forming predeterminate side, of the gate electrode 103. In the present embodiment, slits 104 are formed at both ends of the gate electrode 103 without being provided on the drain electrode forming predeterminate side alone (see FIG. 1(*a*)).

A width L1 of each slit 104 is formed to about 0.5 μm, for example. A length L2 extending from the end of the slit 104 to the end of the gate electrode 103 is formed so as to assume or take about 0.5 μm, for example. The slits 104 are not formed so as to divide the gate electrode 103 as is understood on seeing the schematic plan view of FIG. 2(*b*). The slits 104 are formed only in regions in which low-density diffused layers to be described in a subsequent process are formed. Electrode ends 105 located outside the slits 104 shown in FIG. 1(*a*) are parts of the gate electrode 103 and integrated.

Figure 1B:
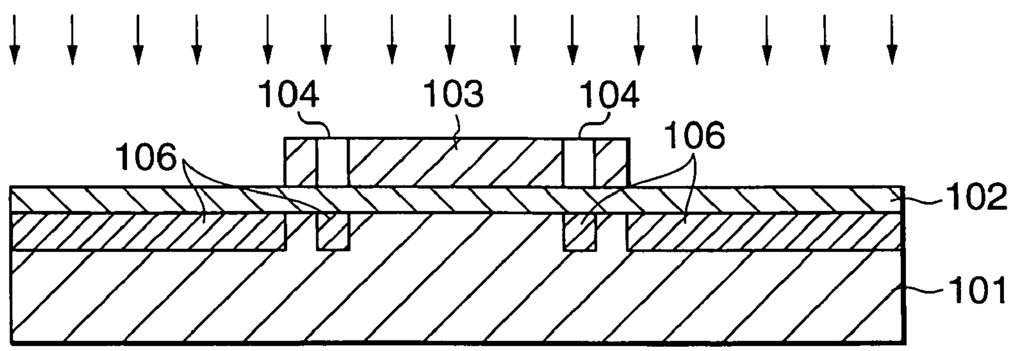
Figure 1C:
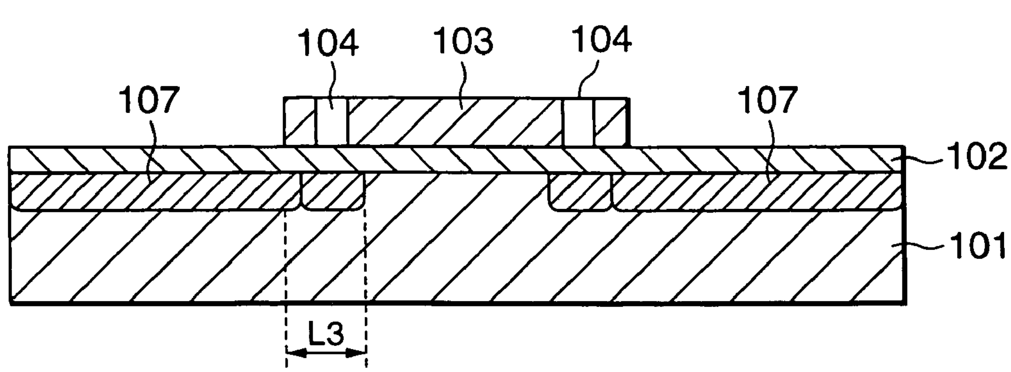
Figure 2A:
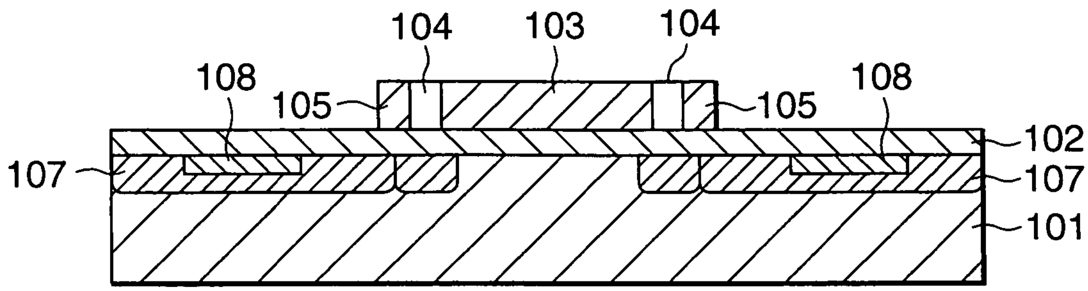
FIGS. 2(*a*) and 2(*b*) show a semiconductor device illustrating a second embodiment, wherein FIG. 2(*a*) is a schematic sectional view of a device section, and FIG. 2(*b*) is a schematic plan view of the device section.
Figure 2B:
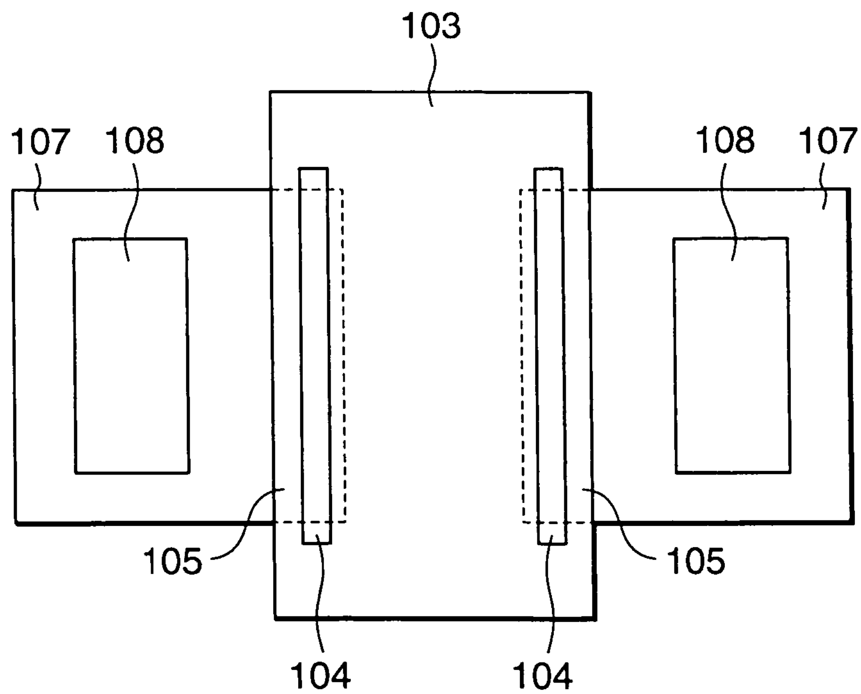
Figure 3A:
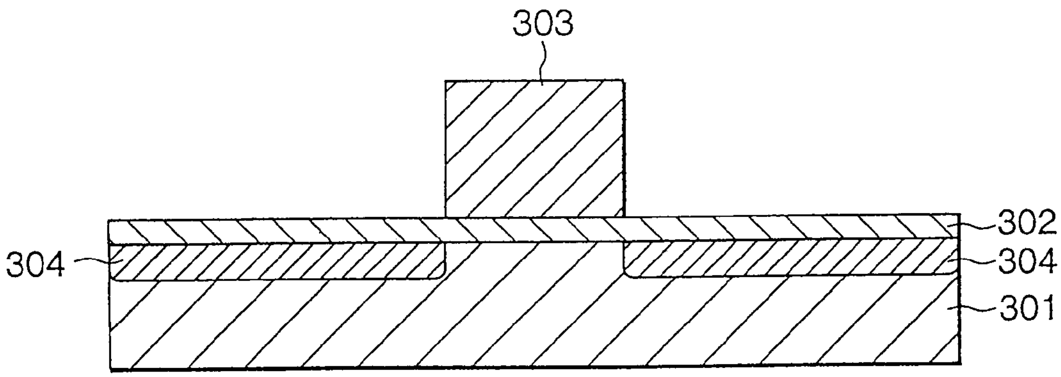
FIGS. 3(*a*)–3(*c*) are process sectional views showing a conventional method of manufacturing a semiconductor device, wherein FIG. 3(*a*) is a view subsequent to the formation of N type low-density diffused layers, FIG. 3(*b*) is a view subsequent to the formation of a gate electrode, and FIG. 3(*c*) is a view subsequent to the formation of N type high-density diffused layers.
Figure 3B:
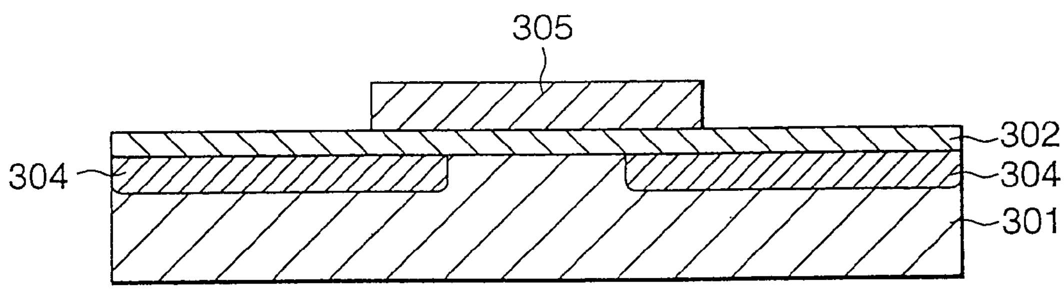
Figure 3C:
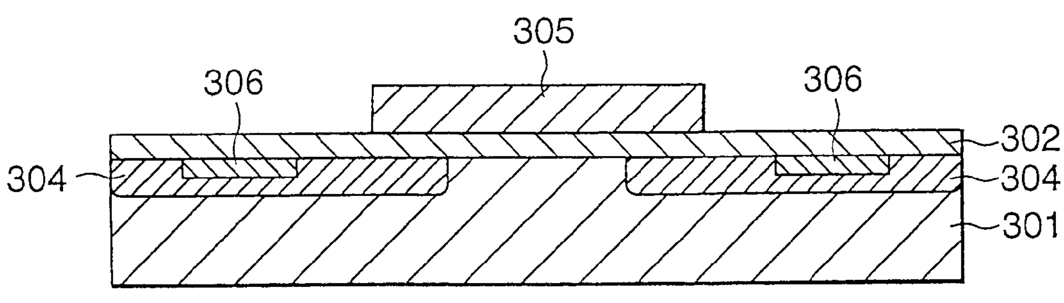

Next, an N type impurity such as phosphorus ions are implanted on a self-alignment basis at a dose of 6.0 E+12 $cm^{-2}$ as a second conductivity type impurity by the known ion implantation technique to form impurity-implanted regions 106 (see FIG. 1(*b*)). At this time, the N type impurity is injected into not only the outside of the gate electrodes 103 but also the slits 104.

Next, heat treatment is done at 1000° C. for about 100 minutes in an $N_2$ atmosphere, for example, by the known diffusion technique to activate the N type impurity, thereby forming N type low-density diffused layers 107 each corresponding to a second conductivity type layer (see FIG. 1(*c*)). The N type low-density diffused layers 107 result in source/drain field relaxation layers of the MOS transistor.

While the N type low-density diffused layers 107 are formed in the main surface of the P type semiconductor layer 101 here, the impurity-implanted regions 106 formed below the slits 104 and the impurity-implanted regions 106 formed outside the gate electrode 103 are diffused in a transverse direction by heat treatment used for activating processing and thereby integrated, thus resulting in the N type low-density diffused layers 107.

Thus, the N type low-density diffused layers 107 overlap with the gate electrode 103 under the gate electrode 103. Consequently, the N type low-density diffused layers 107 each of which comes to an overlap length L3, are formed in a self-alignment with the gate electrode 103. The overlap length L3 is formed as the sum of the slit width L1 of about 0.5 μm, the length L2 of about 0.5 μm from the slit to the end of the gate electrode, and about 1.3 μm set in consideration of the transverse direction.

Although the overlap length L3 should be set according to device's high breakdown voltage specs, it can be set to a desired value from the width L1 of the slit 104 and the length L2 from the end of the slit 104 to the end of the gate electrode 103. The length L2 from the end of the slit 104 to the end of the gate electrode 103 needs to reach a length integrated by transverse diffusion based on the heat treatment. The length L2 may preferably be determined depending on the depth and density of each formed impurity-implanted region, etc.

Next, a resist pattern is formed by, for example, the known photolithography process. Afterwards, an N type impurity such as As is implanted at a dose of about 1.0 E+15 $cm^{-2}$ by the known ion implantation technique to form N type high-density diffused layers 108 each corresponding to a second conductivity type high density layer for contacting a source electrode and a drain electrode of the MOS transistor, whereby a device sectional structure shown in FIG. 2(*a*) is obtained. Incidentally, at this time, the N type high-density diffused regions 108 are formed away from the gate electrode 103.

Subsequently, a high voltage MOS transistor having such a structure that low-density diffused layers and a gate electrode overlap, is formed via contact formation and wiring formation. Incidentally, both the contact formation and wiring formation are done using the known technique and are not shown in the figures.

According to the first embodiment as described above, low-density diffused layers having overlapped with a gate electrode on a self-alignment basis can be formed. There was no need to take into consideration dimensions corresponding to photolithography alignment allowances related to the overlapped portions of the low-density diffused layers and the gate electrode. That is, since an overlap length may not be set long more than necessary as in the prior art, a reduction in transistor size is enabled.

Second Embodiment

The semiconductor device fabricated using the first embodiment will next be explained as a second embodiment. An N type MOS transistor will now be described as an example with reference to FIGS. 2(*a*)–2(*b*) in a manner similar to the first embodiment.

An insulating film 102 corresponding to a gate insulating film is formed on a P type semiconductor layer 101 corresponding to a first conductivity type layer of a semiconductor substrate. N type low-density diffused layers 107 each corresponding to a second conductivity type layer for field relaxation are formed within the P type semiconductor layer 101. A gate electrode 103 has slits at both ends thereof. The N type low-density diffused layers 107 overlap in regions at both ends of the gate electrode 103 containing the slits 104. The gate electrode 103 is formed so as to straddle the N type low-density diffused layers 107 on both sides thereof. In the present embodiment, the slits 104 are provided at both ends of the gate electrode 103 and the N type low-density diffused layers 107 overlap in the regions on both sides of the gate electrode 103. It is however preferable to provide slits at, at least, one ends on the forming side of a drain electrode and cause the N type low-density diffused layers 107 to overlap.

Further, N type high-density diffused layers 108 for contacting the drain electrode and a source electrode (not shown) are respectively formed within the N type low-density diffused layers 17 away from the gate electrode 103. Here, the slits 104 of the gate electrode 103 are formed only in regions of the N type low-density diffused layers 107 as shown in FIG. 2(*b*). An overlap length in which a region lying under the gate electrode 103 and each N type low-density diffused layer 107 overlap, and the density of the N type low-density diffused layer 107 may preferably be determined according to device's high breakdown voltage specs.

The slits 104 defined in the gate electrode 103 do not adversely affect device characteristics, and portions corresponding to electrode ends 105 located outside the slits 104 function in the direction to store or accumulate electrical charges in the surfaces of the N type low-density diffused layers 107 lying under the electrode ends 105 corresponding to gate electrode ends during the operation of the transistor, thus enabling an improvement in drive capacity.

Further, it may be mentioned that as the feature of the present embodiment, the densities of the N type low-density diffused layers 107 lying under the electrode ends 105 are lower than those of the N type low-density diffused layers 107 at other portions such as the portions outside the slits 104 and the gate electrode 103. This is because the low-density diffused layers are diffused in a transverse direction and integrated in the process of activating impurity-implanted regions under the electrode ends 105 by heat treatment according to the manufacturing method of the first embodiment. Therefore, the integrated boundary portions are lower in density than other portions.

Since the gate electrode ends are generally spots where a transverse electric field as viewed from the low-density diffused layer side and a longitudinal electric field as viewed from the gate electrode collide with each other, the concentration of electric field becomes the strictest. Since, however, the density under each gate electrode end can be lowered in particular, it is possible to restrain the concentration of electric field effectively and suppress the occurrence of hot carriers.

Thus, the structure of the second embodiment has the length commensurate with the high breakdown voltage specs, in which the gate electrode and each low-density diffused layer overlap. Further, since both ends lying under the gate electrode are low in density in particular, a structure that enables miniaturization can be obtained while retaining a high breakdown voltage and improving reliability.

While the preferred embodiments of the present invention have been described above with reference to the accompanying drawings, it is needless to say that the present invention is not limited to the above embodiments. It will be apparent to those skilled in the art that various modifications and changes can be supposed to be made to the invention within the scope described in the following claims. It should be understood that those modifications and changes fall within the technical scope of the present invention.

While the present embodiment has explained the N channel type MOS transistor, a P channel type MOS transistor is also similarly applicable by reversing all of N and P types described above.

The present invention is applicable to a semiconductor device, particularly, a high breakdown voltage spec-based MOS transistor and its manufacturing method, and particularly to a semiconductor device capable of miniaturizing or scaling down device's dimensions while maintaining a high breakdown voltage and its manufacturing method.

What is claimed is:

1. A method of manufacturing a semiconductor device, comprising:

forming a gate insulating film on a first conductivity type layer of a semiconductor substrate;

forming on the gate insulating film, a gate electrode having slits at, at least, one end thereof;

selectively implanting a second conductivity type impurity in the first conductivity type layer with a gate electrode as a mask; and effecting heat treatment to activate the impurity and integrating impurity regions in which the impurity is implanted in the slits, and impurity regions in the neighborhood of the slits in which the impurity is implanted in portions outside the gate electrode, thereby forming a pair of second conductivity type layers which overlap with the gate electrode, at the one end thereof; and forming within the pair of second conductivity type layers, a pair of second conductivity type high-density layers which are spaced away from the gate electrode and adapted to contact source and drain electrodes respectively.

2. The method according to claim 1, wherein length from an end of each of the slits to an end of the gate electrode in the vicinity of the slits is formed to a length in which the impurity regions in which the impurity is implanted in the slits and the impurity regions in the neighborhood of the slits in which the impurity is implanted in the portions outside the gate electrode, are integrated by transverse diffusion based on heat treatment.

3. A semiconductor device comprising:

a pair of second conductivity type layers formed away from each other within a first conductivity type layer of a semiconductor substrate;

a gate insulating film formed over the first conductivity type layer and the pair of second conductivity type layers;

a gate electrode formed on the gate insulating film so as to connect the pair of second conductivity type layers and overlap with the second conductivity layers on, at least, one side of the gate electrode, said gate electrode having slits at portions above ends of the overlapped second conductivity type layers; and a pair of second conductivity type high-density layers respectively formed within the pair of second conductivity type layers so as to be spaced away from the gate electrode and to contact a source electrode and a drain electrode respectively.

4. A semiconductor device according to claim 3, wherein the second conductivity type layers are lower in density at portions below ends of the gate electrode which are located outside the slits than at other portions of the second conductivity type layers.

5. A semiconductor device according to claim 3, wherein a length in which the second conductivity type layers and the gate electrode overlap, is determined according to a device high breakdown voltage.

* * * * *